United States Patent [19]
Barber

[11] Patent Number: 5,950,837
[45] Date of Patent: Sep. 14, 1999

[54] SHIPPING KIT ASSEMBLY FOR CIRCUIT PACKS

[75] Inventor: Robert John Barber, Carleton Place, Canada

[73] Assignee: Northern Telecom Limited, Montreal, Canada

[21] Appl. No.: 09/110,454

[22] Filed: Jul. 7, 1998

[51] Int. Cl.[6] .................................................. B65D 85/90
[52] U.S. Cl. ......................... 206/722; 206/451; 206/701
[58] Field of Search ..................... 206/577, 701, 206/706–708, 713, 719, 722

[56] References Cited

U.S. PATENT DOCUMENTS

| | | | |
|---|---|---|---|
| 3,709,358 | 1/1973 | Andrews et al. | 206/451 |
| 3,716,760 | 2/1973 | Bertellotti et al. | 211/41.17 |
| 4,156,498 | 5/1979 | Miller | 206/451 |
| 4,527,222 | 7/1985 | Swingley, Jr. | 206/509 |
| 4,600,231 | 7/1986 | Sickles | 211/41.17 |
| 5,664,681 | 9/1997 | Derouiche | 206/722 |

*Primary Examiner*—Jim Foster
*Attorney, Agent, or Firm*—Gowling, Strathy & Henderson; Bruce Dudley

[57] ABSTRACT

A shipping kit assembly is disclosed for use in transporting circuit packs installed in electronic bays. The assembly kit includes a pair of spaced, upper and lower channel members which, together with a vertical band strap received in and retained thereby, are adapted to secure and support a plurality of circuit packs which are installed in shelf units or sub-racks for shipping or transporting therein. The bottom channel member incorporates a supporting bracket at each end therefor for securing and locating an attached circuit pack in a predetermined location in the shelf unit or sub-rack. One or more horizontal band straps may be used to secure the packs against movement in the shelf unit.

8 Claims, 11 Drawing Sheets

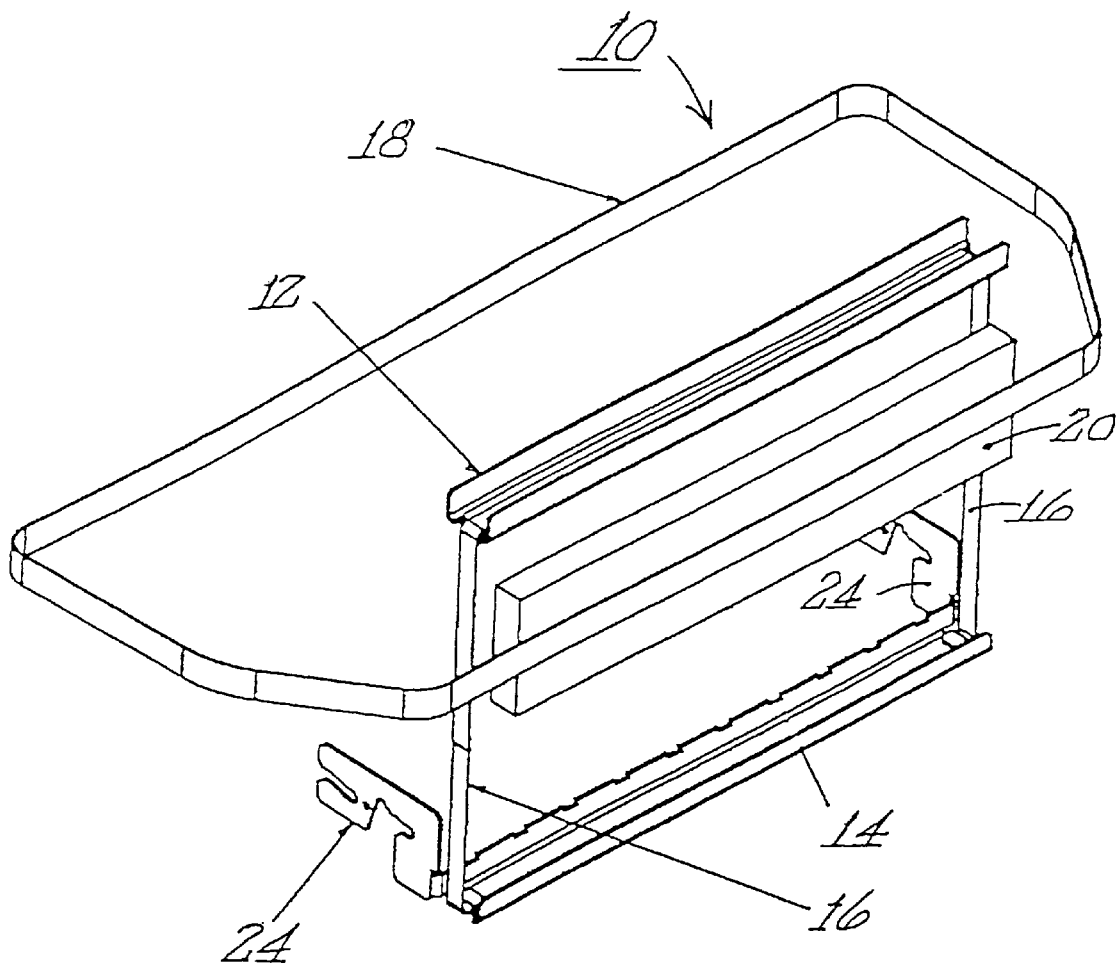
FIG·1·

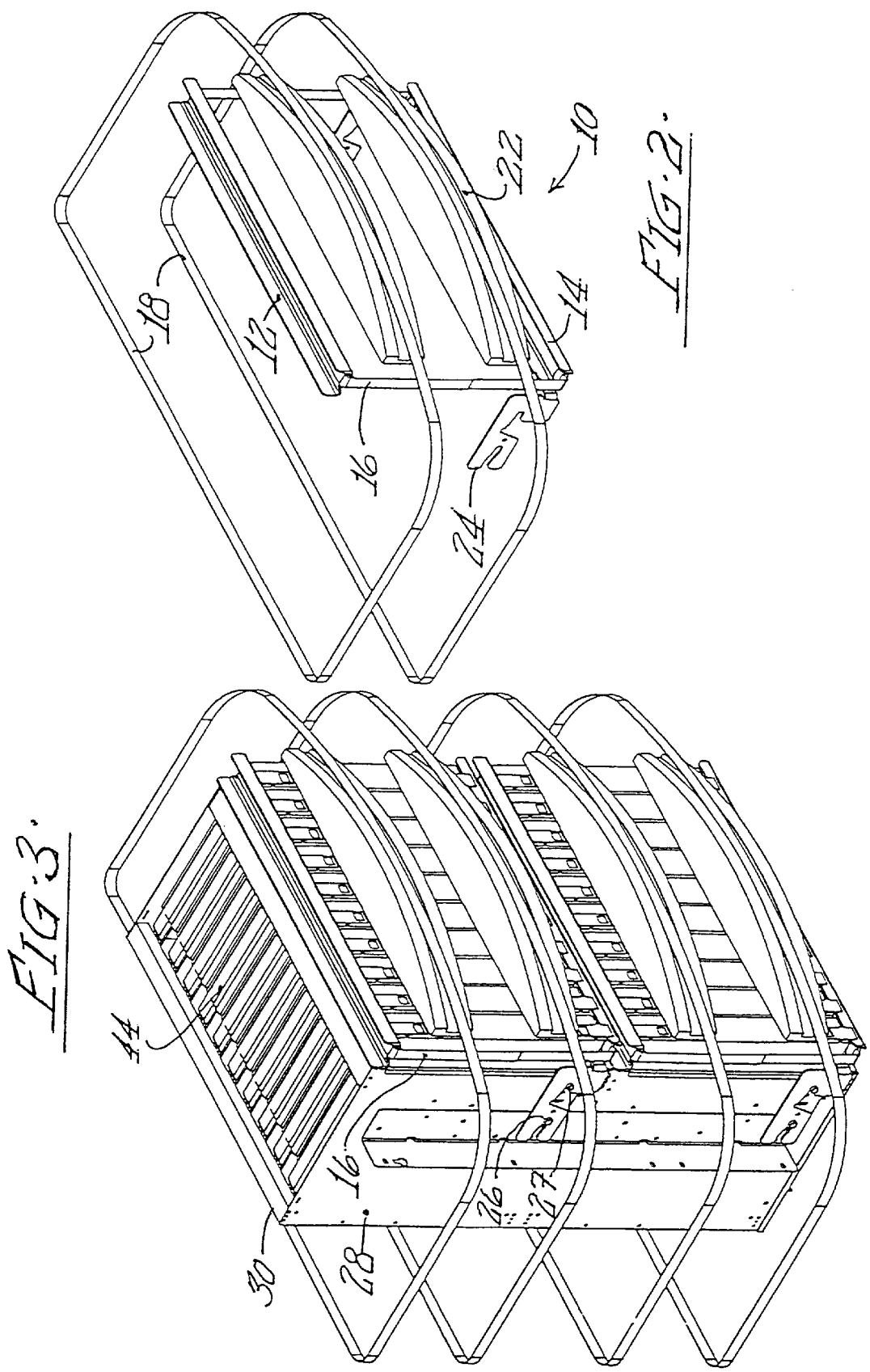

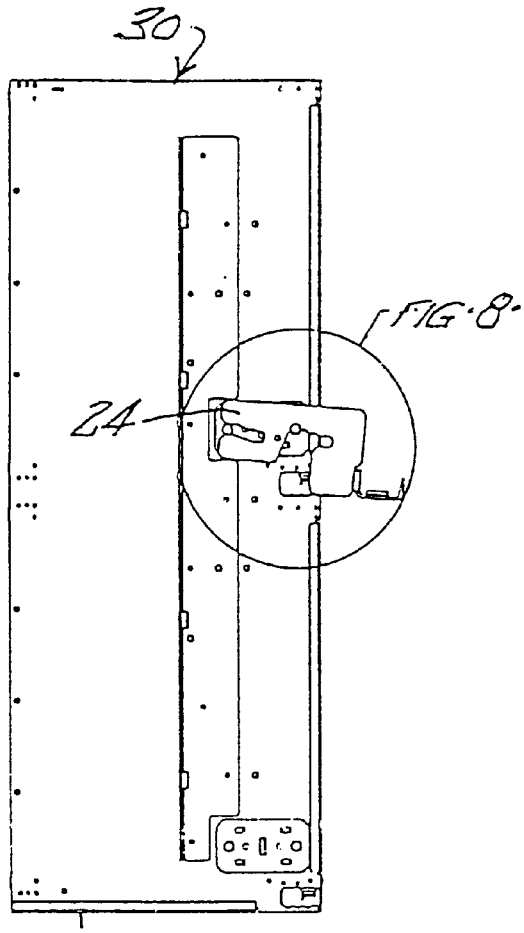
FIG·7·
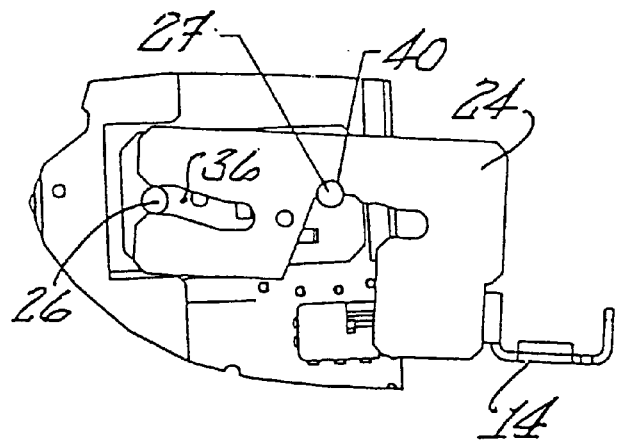
FIG·8·

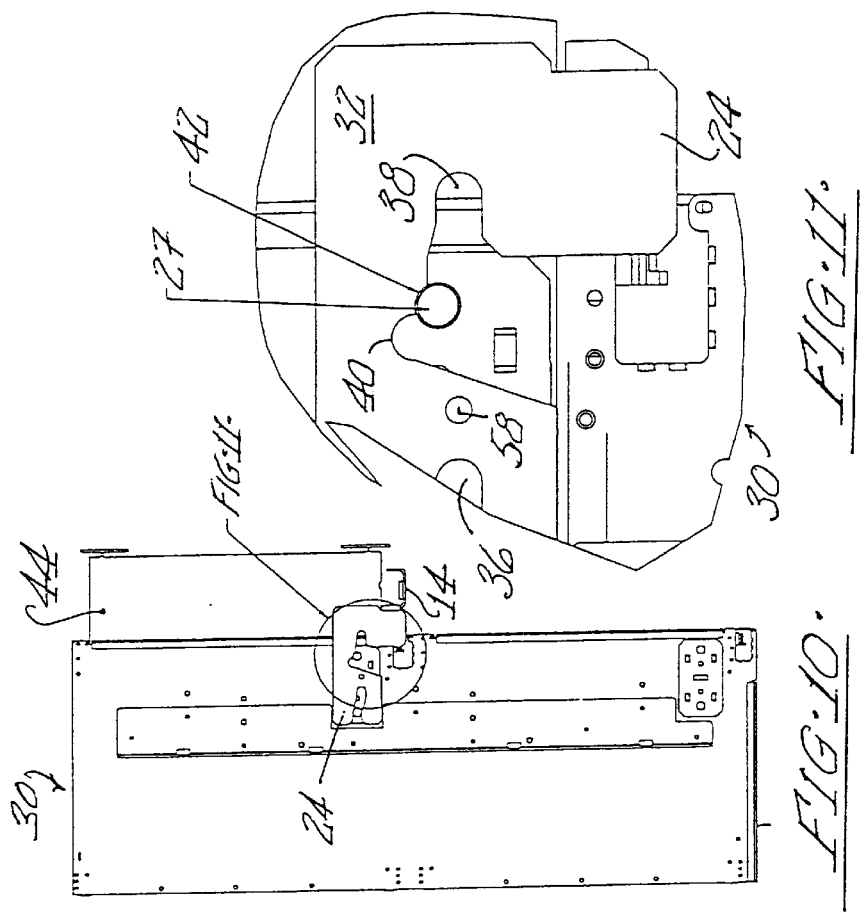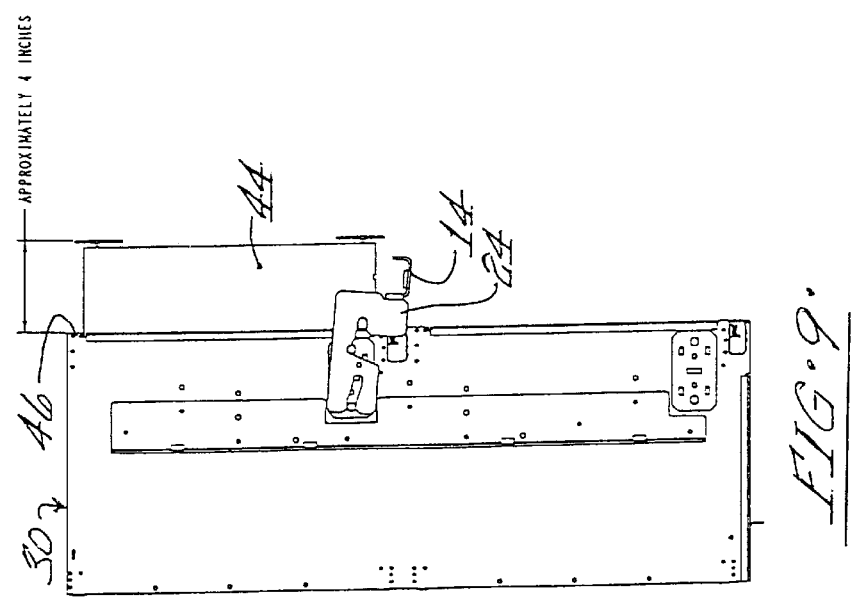

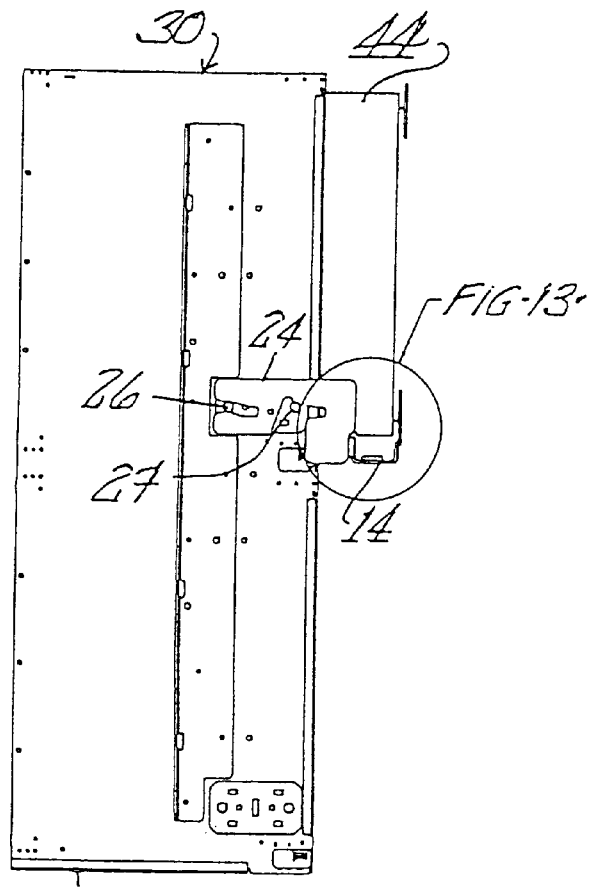
FIG·12·
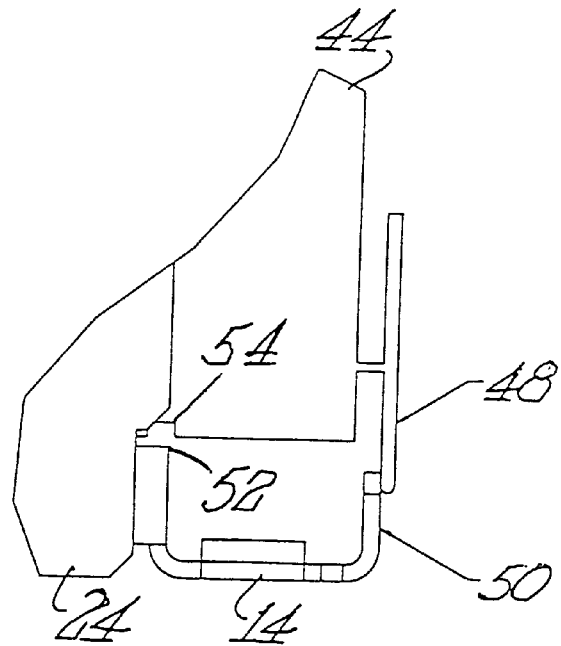
FIG·13·

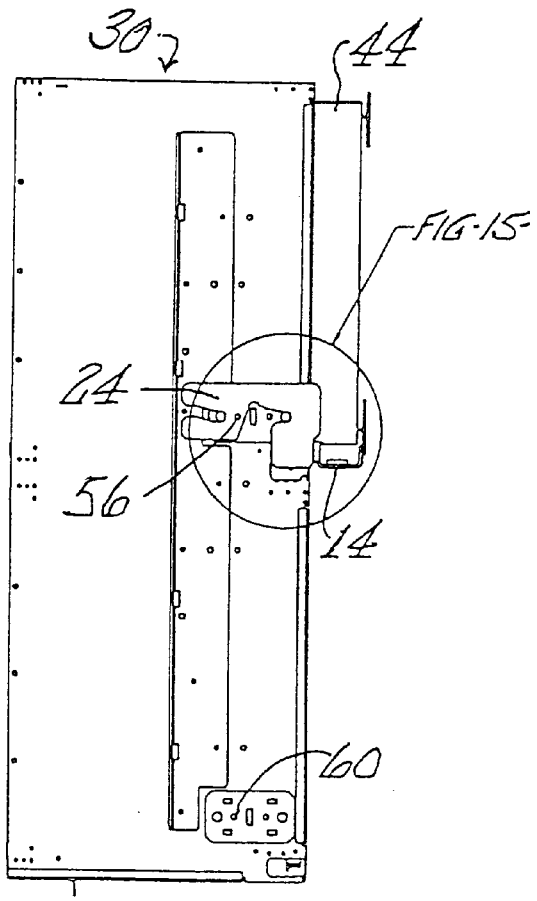
FIG-14-
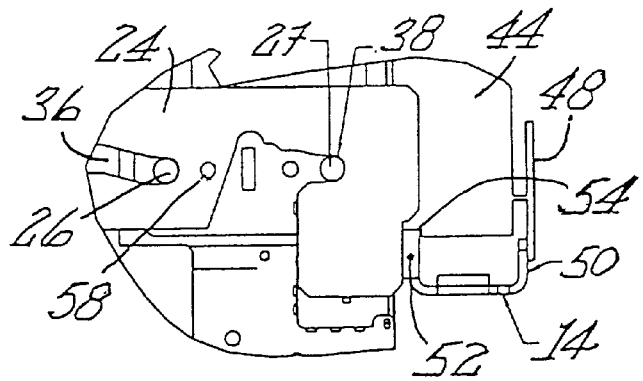
FIG-15-

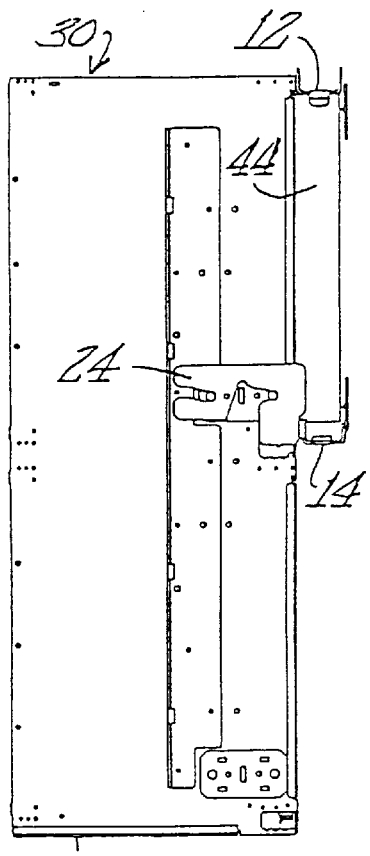
FIG·16·
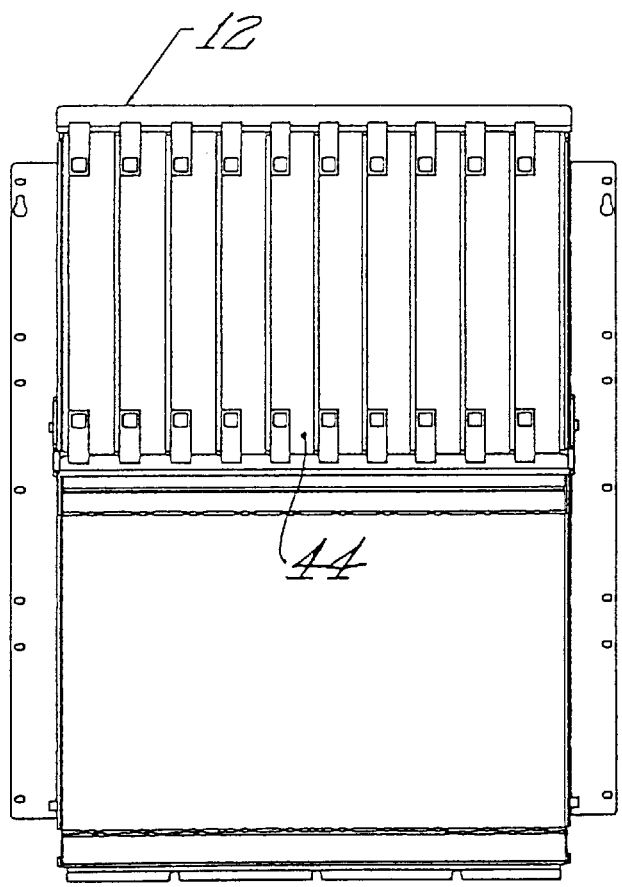
FIG·17

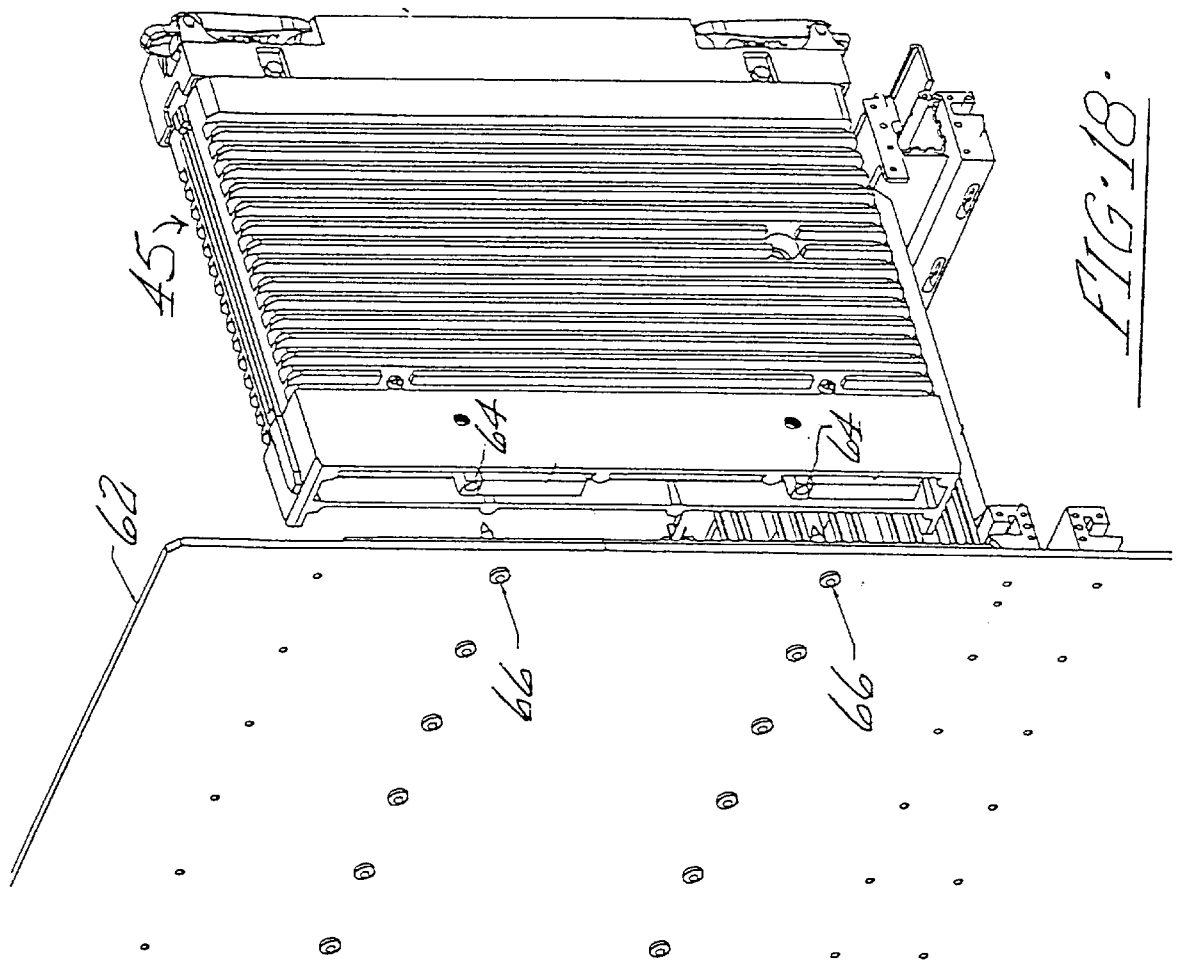

SHIPPING KIT ASSEMBLY FOR CIRCUIT PACKS

FIELD OF THE INVENTION

This invention relates to the packing and shipping of articles and, in particular, to a shipping kit assembly for use in transporting circuit packs in shelf units or sub-racks of electronic bay products.

BACKGROUND OF THE INVENTION

There has been a requirements for manufacturers to ship electronic bay products with all the circuit packs installed in their associated shelf units or sub-racks. However, it was found that if the circuit packs were fully inserted into the backplane connectors of the shelf units, the vibration which occurs during shipping and transportation caused gold plating on the backplane pins to be fretted or eroded. While the loss of gold on the pins does not degrade performance immediately, it will result in a significant reduction of signal integrity life expectancy. Furthermore, due to the size and weight of the circuit packs, additional support would be required.

Traditionally, circuit packs have been shipped by the manufacturer to customers in custom-designed cardboard containers lined with shock absorbing foam. Substantial costs are involved in material, storage, labour and transportation at both the manufacturing and the customer ends of the procedure with respect to such containers. Therefore, while bay products have been shipped with packs installed into the backplane connectors this form of shipping can expose the manufacturer to long term reliability problems.

Other known solutions to shipping with packs in place have been to employ various pieces of foam material to space the packs away from the backplane. These techniques were not very reliable and could result in having small pieces of the foam contaminating the electronics. Additionally, these solutions did not give the packs the added structural support required for the high vibration and shock forces that would be encountered during surface transportation, especially with respect to larger, heavier products.

Two examples of conventional shipping arrangements may be seen in U.S. Pat. No. 3,973,720 of Aug. 10, 1976 and U.S. Pat. No. 4,072,230 of Feb. 7, 1978.

U.S. Pat. No. 3,973,720 Schmid shows a conventional form of protective cushioning pad for shipping articles that require substantial protection against damage by abrasions, shocks and the like. This specification discloses a protective pad that is formed from a single piece of substantially flat resilient material that is formed into at least two discrete sections, each of which is foldable with respect to another section to form a protective envelope for such articles as electronic instruments and the like. The product incorporates protective cushioning pads and includes fold retention means formed from elongated metallic strips which are sufficiently malleable to permit consecutive folding and unfolding of the container.

U.S. Pat. No. 4,072,230 Mulligan discloses a support assembly for positively gripping relatively large units of electronic equipment in order to minimize damage thereto during shipping. It consists essentially of a normally horizontal base assembly with a pair of upstanding end braces that are rigidly secured to the base assembly at opposite ends thereof. A frame or panel having the electronic equipment rests on the base assembly between the end braces each of which includes a pair of vertical clamping members which are movable towards or away from one another for clamping engagement with an end of the equipment frame. Each end brace also includes normally horizontal clamping members which are movable towards or away from the base member for clamping engagement with another part of the frame such as an edge thereof.

SUMMARY OF THE INVENTION

The present invention addresses the above mentioned shortcomings of conventional shipping practices by providing a shipping kit assembly which includes hardware that detachably connects to the side walls of shelf units and supports the circuit packs in a position which is within the shelf but wherein the packs are spaced from and therefore not physically mated into the backplane connectors. Accordingly, during shipping from the manufacturer to the customer's site, the circuit packs are installed in the bay and are given additional support and protection from damage. The support structure can be installed and removed before or after the circuit packs are placed into the shelves. There is an aspect in the invention that enables all of the packs in one shelf to be quickly and accurately located on a bottom bracket before final strapping is performed.

The hardware of the shipping kit assembly can be returned to the manufacturer or, due to its low cost, can be discarded by the customer.

A bay, equipped with circuit packs, is configured, burned in and tested at the manufacturers. There are advantages to the manufacturer to be able to send the complete tested bay directly to the shipping area. Aside from the obvious cost benefit, there are additional benefits in that when the product arrives at the customer's site, some of the start up testing activity does not have to be done if the circuit packs are installed in the original location in which they were tested in the factory.

Some customers insist on having bays shipped to them with circuit packs in place. The present invention removes the risks from this procedure and ensures long product signal life.

The shipping kit assembly of the present invention incorporates hardware that was originally designed for shipping bays in a vertical orientation but it will be appreciated that, notwithstanding the vertical orientation arrangement described and illustrated in the following specification, the invention is not to be restricted thereto as shipping may also be carried out in a horizontal arrangement.

In the examples illustrated, high speed optical circuit packs are completely enclosed in an aluminum casting which is required for heat dissipation and for EMC containment. Accordingly, these circuit packs weigh on the average about 8 to 10 pounds. The present invention addresses the problem of providing extra support for the packs to reduce stress to the shelf crossmembers during transportation. The circuit packs are located at a position slightly forward (or outwardly) of the backplane connectors to thereby avoid the physical contact and eroding problems referred to earlier.

The hardware of the kit assembly according to the invention is capable of being installed or removed with circuit packs in or out of the shelves, with relative ease; and the kit assembly is a low cost production item.

Beneficially speaking, the present invention provides for fully configured bays to be shipped to customers with no fear of structural damage or connector life degradation and the manufacturer realizes savings in costs of packing material, storage of boxes, labour in packing the circuit packs and extra shipping charges.

In addition to the tested bay configuration now being carried through to the "in service" condition, the absence of having to deal with disposal of packing material and the cost of unpacking and installing circuit packs in the bays is a saving for the customer.

According to a broad aspect, the invention relates to a shipping kit assembly for transporting a plurality of circuit packs in shelf units or sub-racks. The kit assembly comprises a pair of members adapted to clamp between them a plurality of the circuit packs with means for securing and retaining the clamping members in their pack-clamping position.

A pair of parallel supporting brackets are provided on the lower one of the pair of clamping members, one at each end thereof and extending normal thereto; and recesses in the supporting brackets are adapted to cooperate with and engage a plurality of locating members on the side surfaces of the shelf units to thereby secure and locate the clamped circuit packs in a predetermined location in the shelf unit or sub-rack.

According to a further broad aspect, the invention relates to a shipping kit assembly for transporting circuit packs in shelf units or sub-racks. The kit assembly comprises a pair of spaced, upper and lower clamping members adapted to engage opposite surfaces of a plurality of circuit packs. A tensionable band strap is provided for securing and retaining the clamping members in their pack-engaging position. A pair of parallel supporting brackets are provided on the lower clamping member, one at each end thereof and extending normal thereto and a plurality of slots in the supporting brackets are adapted to cooperate with and engage a plurality of locating pins on the sides of the shelf units thereby securing and locating the attached circuit packs in a predetermined location in the shelf unit or sub-rack.

At least one tensionable, horizontally oriented band strap secures the circuit packs in the shelf unit or sub-rack.

BRIEF DESCRIPTION OF THE DRAWINGS

The invention is illustrated, by way of example, in the accompany drawings in which:

FIG. 1 is an isometric view of one embodiment of a shipping kit assembly according to the invention;

FIG. 2 is an isometric view of the assembly shown in FIG. 1 but with a modified tension strap arrangement;

FIG. 3 is an isometric view of a shelf unit with circuit packs mounted therein using the present invention;

FIG. 7 is a side view similar to FIG. 5 and illustrates a second step in the assembly;

FIG. 8 is an enlarged detail of the encircled area shown in FIG. 7;

FIG. 9 is a side view similar to FIG. 7 and illustrates a third step in the assembly with circuit packs partially installed;

FIG. 10 is a side view similar to FIG. 9 and illustrates a fourth step in the assembly;

FIG. 11 is an enlarged, detailed view of the encircled portion illustrated in FIG. 10;

FIG. 12 illustrates the fifth step in the assembly;

FIG. 13 is an enlarged view of the encircled area illustrated in FIG. 12;

FIG. 14 illustrates the sixth step in the assembly;

FIG. 15 is an enlarged view of the encircled area illustrated in FIG. 14;

FIG. 16 is an end view illustrating the seventh step in the assembly;

FIG. 17 is a front elevation view of the arrangement shown in FIG. 14;

FIG. 18 is an isometric view of a circuit pack located in the shelf unit in accordance with the present invention;

DETAILED DESCRIPTION OF THE PREFERRED EMBODIMENT

Figure 4:
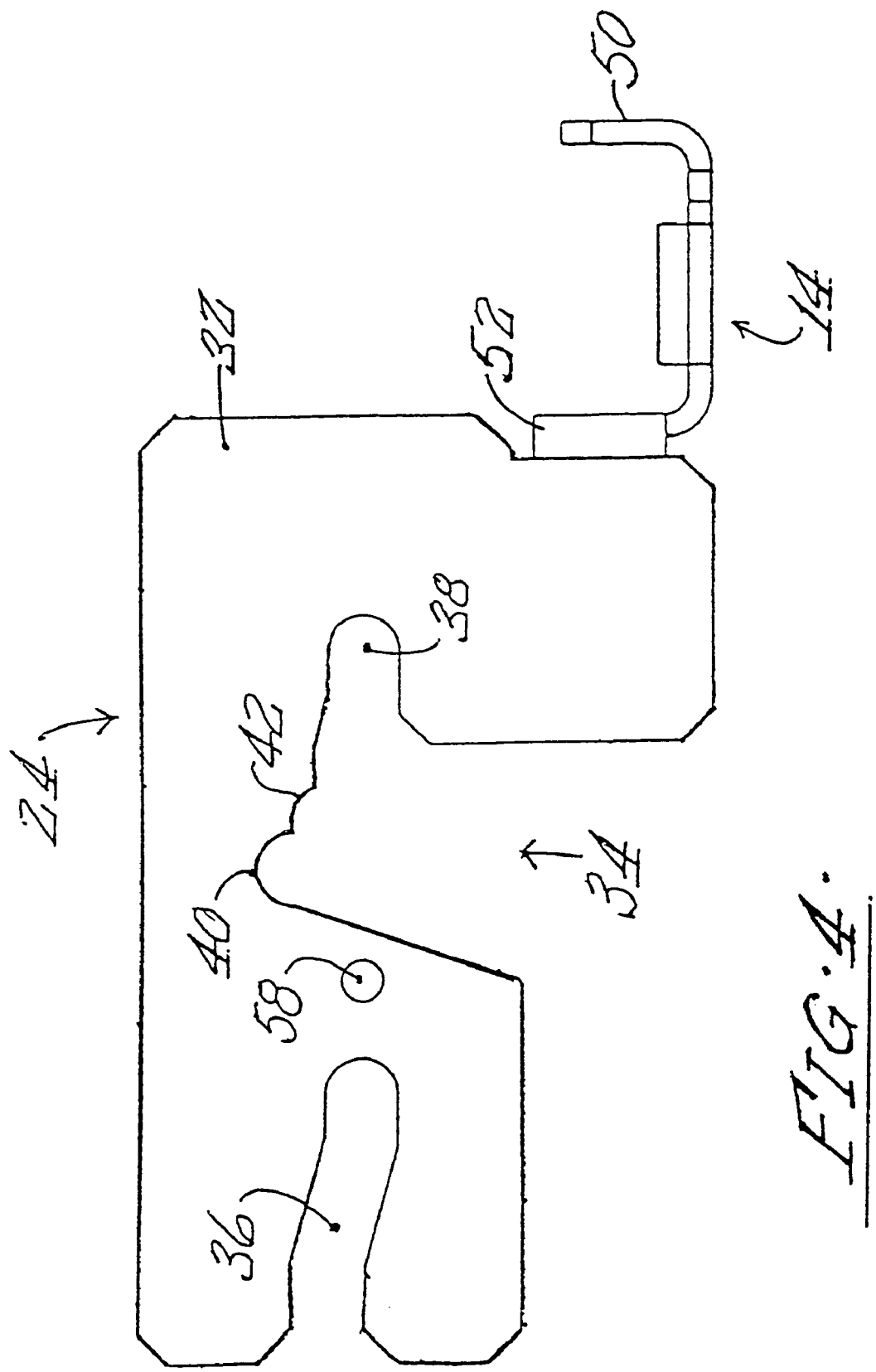
FIG. 4 is an elevation view of a bottom supporting bracket at one end of one of the channel members.

Referring to FIGS. 1 and 2, a shipping kit assembly according to the invention is illustrated generally at 10 and comprises a pair of upper and lower channel members 12 and 14 respectively. In the illustrations of FIGS. 1 and 2, the elements of the kit assembly are shown in the positions they would assume after being applied to circuit packs in shelf units as illustrated for example in FIG. 3. In other words, the kit assemblies shown in FIGS. 1 and 2 are in their "shipping" positions but minus the associated products.

The upper and lower channel members 12 and 14 are located parallel to one another but spaced by opposite surfaces of the circuit packs which they engage as shown in FIG. 3. A tensionable band strip 16 engages both channel members 12 and 14 and retains those members in their pack-engaging position. The assembly further comprises at least one tensionable, band strap 18 oriented at right angles to the band strap 16 and, together with inserts of foam or other such suitable material, serve to secure the circuit packs in the shelf unit or sub-rack. It will be noted that the shock absorbing foam units 22 in FIG. 2 are of a somewhat different configuration than foam units 20 shown in FIG. 1.

As shown in FIGS. 1 and 2, the lower channel member 14 is provided with a pair of parallel, supporting brackets 24, one at each end thereof and extending normal thereto. Briefly, and as shown in FIG. 3, when the shelf unit and its circuit packs are fully assembled utilizing the shipping kit of the present invention, the supporting brackets 24 cooperate with and engage pins 26 and 27 on the end walls of a shelf unit 30.

FIG. 4 is an elevation view of one of the support brackets 24 at one end of the lower channel member 14. It will be noted that the support bracket is configured to provide a plurality of slots and recesses for engaging the pins 26 and 27 in the process of assembling a loaded shelf unit 30 to be ready for shipment. As will be described, each of the slots or recesses plays a part in the steps of the assembly to eventually secure and locate the attached circuit packs in a predetermined location in shelf unit 30.

Each supporting bracket 24 is a planar member 32 with a cutout area 34 generally midway of its length on the lower portion thereof. The bracket also includes a first slot 36 at one end thereof and the cutout area 34 defines a second slot 38 as well as a pair of recesses; a first recess 40 and a second, shallower recess 42. These slots and recesses cooperate with and engage the locating pins 26 and 27 on the end walls of the shelf unit 30 when the circuit packs are being positioned and secured in their predetermined locations in the shelf unit. To that end, it will be noted from FIG. 3 (and from FIG. 15) that the spacing of the locating pins 26 and 27 correspond to the distance between the inner ends of slots 36 and 38 of the brackets 24.

FIGS. 5 through 8 inclusive illustrate the first steps in mounting the shipping kit assembly on a shelf unit 30 and, while only one end wall of the shelf unit 30 and only one bracket 24 is illustrated, it will be appreciated that, simultaneously, another bracket 24 at the other end of channel member 14 is being similarly manipulated and mounted on the opposite end wall of the shelf unit 30.

Figure 5:
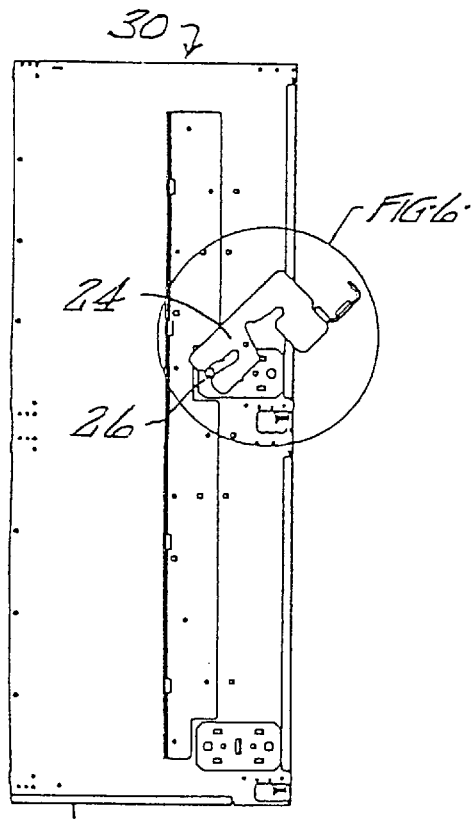
FIG. 5 is a side elevation of a shelf unit and illustrates a first step in attaching the bottom support brackets onto the shelf unit.
Figure 6:
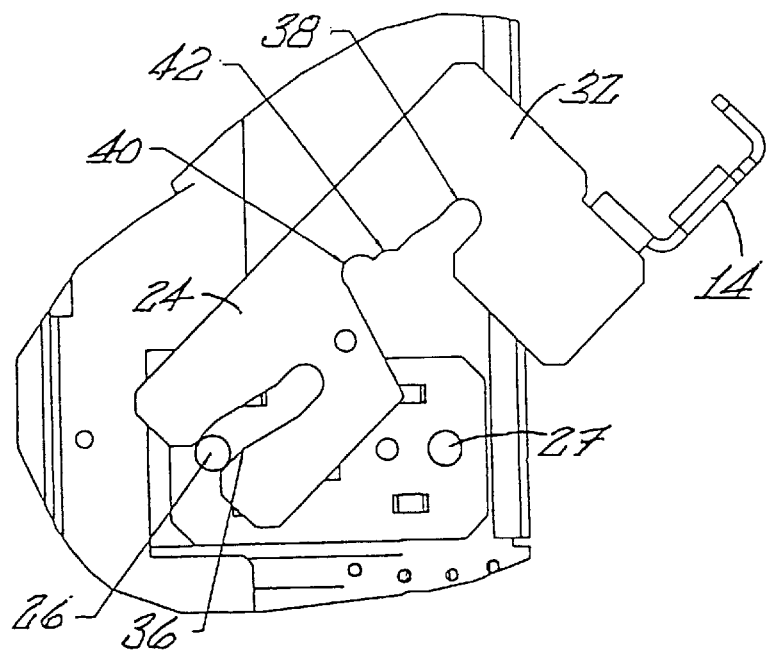
FIG. 6 is an enlarged detail of the encircled portion shown in FIG. 5.

Referring to FIGS. 5 and 6, the first step in the connection between the channel member 14, its brackets 24 and the shelf unit 30 is to place the brackets 24 in a position on either sidewall such that the pins 26 on the sidewalls of the unit 30 are received into the mouths of the slots 36 of the bracket 24, as clearly shown in FIG. 6.

Moving on to FIGS. 7 and 8, the brackets 24 are then lowered so that pins 27 are received in the recesses 40 and the recesses rest against pins 27 on both sides, as shown.

The next steps in the assembly are shown in FIGS. 9, 10 and 11. Referring to FIG. 9, all of the circuit packs 44 are placed into the top portion of the shelf unit 30, leaving approximately 4 inches between the front 46 of the shelf and the front of each module.

The brackets 24 with their channel member 14 are then positioned so that the shallow recess 42 in each bracket 24 rests against pin 27 on each side of the shelf unit 30, FIGS. 11 and 12.

The circuit pack is then gently moved inwardly into the shelf until its lower latch 48 is against the stop flange 50 of the channel member 14, as shown in FIGS. 12 and 13. Note the relationship between the inner flange 52 on the channel member 14 and the bottom groove 54 on the circuit pack 44 as shown in FIG. 13.

Subsequently, brackets 24 with their channel member 14 are gently lifted up so that the inner flange 52 of the channel member 14 engages the bottom groove 54 of each circuit pack 44 as shown in FIGS. 14 and 15 and then the circuit pack 44 with the channel member 14 and the supporting brackets 24 are moved forward until pin 27 is received in the end of slot 38 and pin 26 is received in the inner terminal end of slot 36, on both sides of the unit. At this point, the packs 44 are raised slightly off the shelf crossmembers and their weight is taken by the bracket 14. In that position illustrated in FIG. 15, suitable securing means such as screws 56 are then inserted through the apertures 58 in the brackets 24 to engage the aperture 60 (FIG. 14) in the sidewall of the unit 30, defining the final resting position.

Turning now to FIGS. 16 and 17, the next step in the assembly is to place the upper channel member 12 in position so that it rests on top of the modules 44 as shown. The equipment is then secured by placing the plastic strapping 16 across the top channel member 12 and underneath channel member 14 as shown in FIGS. 1 and 2 and then the strapping is tensioned and sealed at the proper positions so that the unit is secured as shown in FIG. 3.

The foam members 22 are then positioned by placing the plastic strapping 18 across the front of the foam units and around the frame of the unit 30. The strapping is then tensioned and sealed at the proper locations. It has been found that two foam strips and packing straps are preferably used per shelf when half-height modules such as 44 in FIGS. 16 and 17, are being shipped and only one foam strip and packing strap per shelf may be used for the shipping of full height modules.

FIG. 18 shows a circuit pack 45 located in the shelf unit 30 and positioned according to the invention so that the pack 45 is located slightly forward or outwardly of the backplane 62 so that its connectors 64 are spaced from the connector pins 66 in the back plate. This ensures that, even with the absence of foam packing, no physical contact is made between the connectors 64 and pins 66 during transportation, avoiding the eroding problems referred to earlier.

Figure 20:
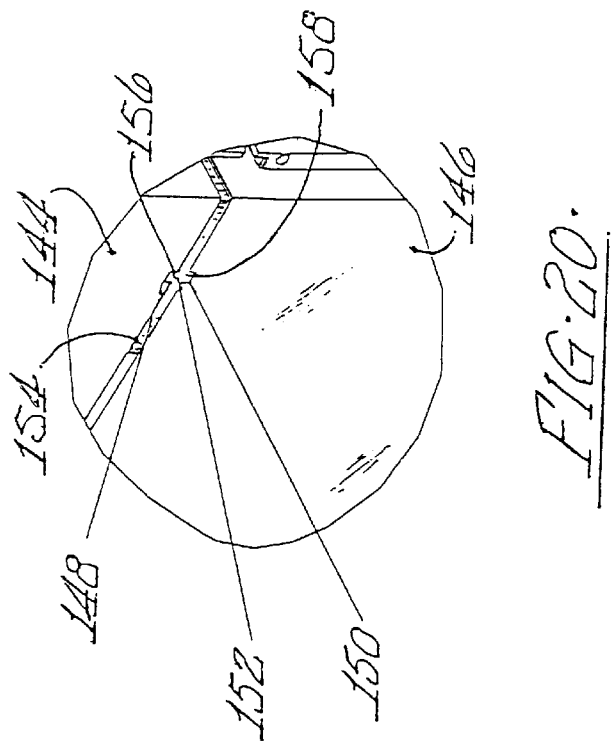
FIG. 20 is an enlarged view of the encircled portion of FIG. 19.
Figure 19:
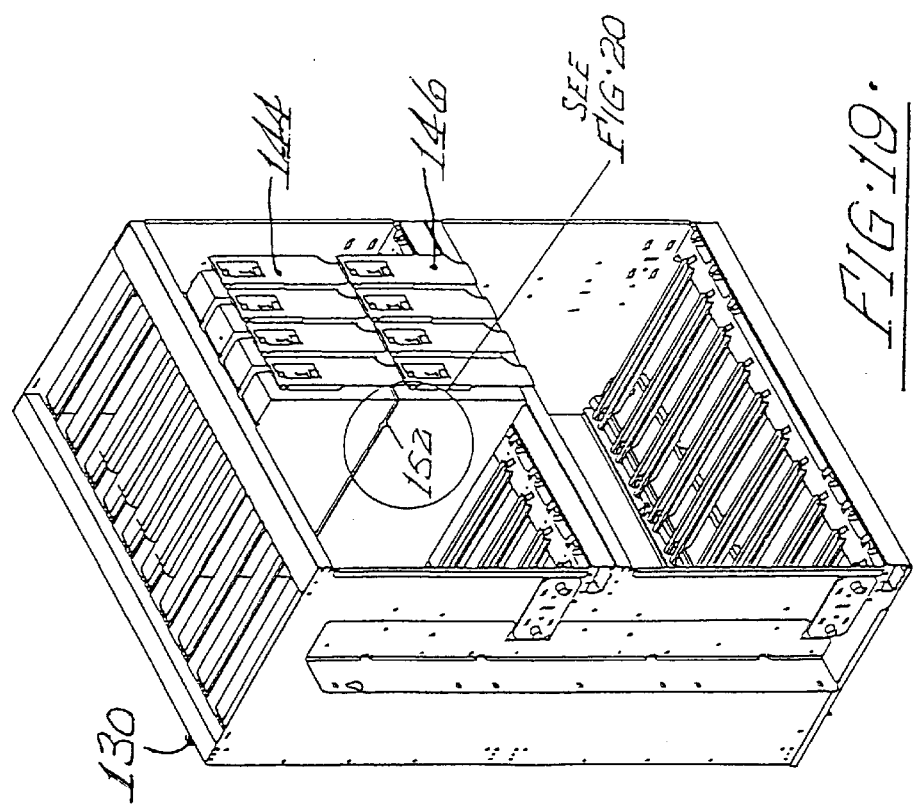
FIG. 19 is an isometric view of a shelf unit including half-height circuit packs therein.

It will be appreciated that full height or half-height configuration circuit packs can be accommodated in the bracketing system of the present invention. FIGS. 19 and 20 illustrate an example of this.

Shelf unit 130 is shown accommodating several upper half-height packs 144 each of which is detachably connected to a lower half-height pack 146. As seen in FIG. 20, upper pack 144 has a groove 148 in its lower surface and it is located directly opposite groove 150 in the upper surface of the lower half-height pack 146. To mate the two half-height packs together a coupling 152 is utilized, and which includes a flat spacer portion 154 and upper and lower flanges 156 and 158 respectively. The coupling 152 is placed between the upper and lower packs with the upper flange 156 engaging groove 148 in pack 144 and flange 158 engaging groove 150 in pack 146. This keeps both packs mated to one another.

While only half-height packs are shown in FIG. 19, both full height and half-height packs can be accommodated in a random mix and match arrangement in the same shelf assembly bracketing system.

While the invention has been described in connection with a specific embodiment thereof and in a specific use, various modifications thereof will occur to those skilled in the art without departing from the spirit and scope of the invention as set forth in the appended claims.

The terms and expressions which have been employed in this specification are used as terms of description and not of limitations, and there is no intention in the use of such terms and expressions to exclude any equivalents of the features shown and described or portions thereof, but it is recognized that various modifications are possible within the scope of the invention claims.

I claim:

1. A shipping kit assembly for transporting a plurality of circuit packs in shelf units or sub-racks, said kit assembly comprising:

a pair of members adapted to clamp between them a plurality of said circuit packs;

means for securing and retaining said clamping members in their pack-clamping position;

a pair of parallel supporting brackets on the lower one of said pair of clamping members, one at each end thereof and extending normal thereto; and recesses in said supporting brackets adapted to cooperate with and engage a plurality of locating members on the side surfaces of said shelf units to thereby secure and locate said clamped circuit packs in a predetermined location in said shelf unit or sub-rack.

2. A shipping kit assembly according to claim 1 wherein said clamping members comprise upper and lower channel-shaped members engaging opposite surfaces of said plurality of circuit packs, said supporting brackets being on the lower channel-shaped member.

3. A shipping kit assembly according to claim 1 wherein said locating members on said shelf units comprise locating screws or pins adapted for engagement by said recesses in said supporting brackets.

4. A shipping kit assembly according to claim 1 wherein the means for securing and retaining said clamping members in position with said circuit packs comprises tensionable and sealable band strapping.

5. A shipping kit assembly for transporting circuit packs in shelf units or sub-racks, said kit assembly comprising:

a pair of spaced, upper and lower clamping members adapted to engage opposite surfaces of a plurality of circuit packs;

a tensionable band strap for securing and retaining said clamping members in their pack-engaging position;

a pair of parallel supporting brackets on said lower clamping member, one at each end thereof and extending normal thereto; and a plurality of recesses in said supporting brackets adapted to cooperate with and engage a plurality of locating pins on the sides of said shelf units thereby securing and locating said attached circuit packs in a predetermined location in said shelf unit or sub-rack.

6. A shipping kit assembly according to claim 5 and further comprising at least one tensionable, horizontally oriented band strap securing said packs in said shelf unit or sub-rack.

7. A shipping kit assembly according to claim 5 wherein said clamping members are channel-shaped.

8. A shipping kit assembly according to claim 1 including locking means for securing said supporting brackets in engagement with said locating pins on said shelf unit.

* * * * *